United States Patent [19]

Bartush

[11] Patent Number: 4,541,169
[45] Date of Patent: Sep. 17, 1985

[54] METHOD FOR MAKING STUDS FOR INTERCONNECTING METALLIZATION LAYERS AT DIFFERENT LEVELS IN A SEMICONDUCTOR CHIP

[75] Inventor: Thomas A. Bartush, Wappingers Falls, N.Y.

[73] Assignee: International Business Machines Corporation, Armonk, N.Y.

[21] Appl. No.: 665,859

[22] Filed: Oct. 29, 1984

[51] Int. Cl.[4] .................. H01L 21/312; H01L 21/461
[52] U.S. Cl. ....................................... 29/591; 29/571; 29/578; 148/DIG. 131; 148/DIG. 100; 156/643; 156/650; 357/49
[58] Field of Search ................. 29/571, 578, 579, 589, 29/591, 579 C, 576 W; 148/1.5, DIG. 131, DIG. 100; 156/643, 650; 427/88; 357/49, 65

[56] References Cited

U.S. PATENT DOCUMENTS

| | | | |
|---|---|---|---|
| 3,801,880 | 4/1974 | Harada et al. | 317/234 |
| 3,976,524 | 8/1976 | Feng | 156/8 |
| 4,025,411 | 5/1977 | Ma et al. | 204/192 E |
| 4,089,766 | 5/1978 | Paal et al. | 204/192 D |
| 4,307,180 | 12/1981 | Pagge | 29/576 W X |
| 4,333,227 | 6/1982 | Horng et al. | 29/576 W X |
| 4,367,119 | 1/1983 | Logan et al. | 156/643 |
| 4,410,622 | 10/1983 | Dalal et al. | 430/312 |
| 4,470,874 | 9/1984 | Bartush et al. | 156/643 |
| 4,506,434 | 3/1985 | Ogawa et al. | 29/576 W X |

OTHER PUBLICATIONS

IBM TDB, May 1984, pp. 6506-6507.
IBM TDB Sep. 1977, p. 1381.
IBM TDB, Feb. 1977, p. 3364.
IBM TDB, Sep. 1980, pp. 1394 and 1395.
IBM TDB, Feb. 1981, p. 4140.

*Primary Examiner*—Brian E. Hearn
*Assistant Examiner*—David A. Hey
*Attorney, Agent, or Firm*—Robert J. Haase

[57] ABSTRACT

Disclosed herein is a method enabling the use of four or more levels of metal over silicon chips whereby increased wiring density, reduced wiring capacitances and improved interconnection reliability are achieved. Stud vertical wiring and special etching procedures to accommodate differences in stud elevation and in stud size, are features which provide substantial planarity in the successive levels.

More particularly, the present method includes steps for: the "lift-off" deposition of metal studs on metal wires resulting from the patterning of the layer of the first level of metallization, deposition of a first insulating layer of a material such as silicon dioxide, planarization of said first layer using a standard etch back technique with a planarization medium, until the most elevated stud is exposed, then deposition of a second insulating layer of a material such as silicon nitride over the structure and the etching of the insulator with the same mask pattern that was used to delineate the studs, in order to expose all of the remaining studs.

8 Claims, 11 Drawing Figures

METHOD FOR MAKING STUDS FOR INTERCONNECTING METALLIZATION LAYERS AT DIFFERENT LEVELS IN A SEMICONDUCTOR CHIP

BACKGROUND OF THE INVENTION

1. Field of Invention

The present invention relates to the manufacture of high performance VLSI semiconductor chips in general and more particularly to a method of manufacturing planarized semiconductor chips having a plurality of levels of metallurgy, according to an improved stud vertical wiring technique which accommodates differences both in stud elevation and stud size.

A semiconductor chip consists of an array of devices whose contacts are interconnected by patterns of metal wires. In VLSI chips these metal patterns are multi-layered and separated by layers of an insulating material. Interconnections between metal wiring patterns are made by holes (or via-holes), which are etched through the insulator. Typical chip designs consist of one or two wiring levels with three wiring levels being the current state-of-the-art technology. Circuit cost and performance continue to place demands on the fabrication processes in such a way that adding additional wiring levels can be competitive even though additional processing steps are required. Obviously, there comes a point in this evolutionary cycle where process architecture has to be changed to allow for circuit designs with ever increasing density requirements. That point appears to be the addition of a fourth level metal and the reduction of via holes to less than several microns.

The isotropic nature of most etchants results in a via hole that is larger than the image printed in the photoresist. This enlargement is called process bias. Process bias has a direct impact on circuit density since it uses up valuable real estate. Creating anisotropy in the formation of a via hole reduces bias and increases density. One process which has anisotropy is Reactive Ion Etching (RIE) with a dry plasma. While zero bias is possible with RIE, it is not practical because the via-hole formed would have vertical sidewalls and the subsequent metal deposition would result in open circuits due to the well known edge coverage problem.

Therefore, RIE processes are usually designed with some degree of process bias to taper the resulting via hole.

Reducing bias further can be accomplished by eliminating the via-hole and replacing it with a via stud or vertical wire, hereafter called a stud. The lift-off process is currently used to form the studs. While the use of the lift-off process has minimized process bias to much less than a micron, it is also required to produce a stud where there is no need for etch stops which would complicate the process. Therefore, it is possible to place studs directly on top of device contacts and eliminate the need for access wiring. In addition, it is also possible to begin thinking about "stacking" studs one on top of the other, to allow for electrical connection between metal wires or lands which are not on the same plane. In short, the replacement of via-hole technique, by the stud technique has produced a synergistic effect of not only reducing process bias to a minimum but also allows for a complete review of current wiring architecture.

In conclusion, studs have definite advantages compared to the via hole technique such as:

1. Multilevel wiring with four (or more levels of wires.
2. Placing studs directly on device contacts without degrading the contact quality.
3. Stacking a stud directly over one another.
4. Planarized surfaces which allow upper levels of metal (2nd, 3rd, 4th, etc.) to have the same ground rules as the first level of metal.
5. Reducing stud size below the current capability of an etched via.
6. Maximize interlevel insulator thickness beyond current capabilities.

2. Prior Art

Because the vertical wiring stud technique has been demonstrated to be such a very powerful scheme for multilevel metallurgy interconnection, abundant literature has been published on the subject.

1. U.S. Pat. No. 4,410,622 to Dalal et al granted Oct. 18, 1983, and assigned to the same assignee as the present invention.
2. An article entitled "Integrated Stud for Multilevel Metal" by J. R. Kitcher published in the IBM Technical Disclosure Bulletin, Vol. 23, No. 4, September 1980, page 1395.
3. An article entitled "RIE Process for Metal Wiring Using a Buried Mask" by J. R. Kitcher published in the IBM Technical Disclosure Bulletin, Vol. 23, No. 4, September 1980, page 1394.
4. U.S. Pat. No. 3,801,880 to Harada et al granted Apr. 2, 1974.
5. An article entitled "Dual Dielectric for Multilevel Metal" by T. A. Bartush published in the IBM Technical Disclosure Bulletin, Vol. 23, No. 9, February 1981, page 4140.
6. U.S. Pat. No. 4,367,119 to Logan et al granted Jan. 4, 1983.
7. U.S. Pat. No. 4,470,874 to Bartush et al. granted Sept. 11, 1984.

References 1, 2 and 3 describe stud formation with the use of metal Reactive Ion Etching (RIE) in chlorine based plasmas. This etching technique requires that an etch barrier which is impenetrable by the etching gas, be used to protect the previously formed metal. Implementing metal RIE is generally not recommended because of the residual contamination caused by chlorine which produces undesired corrosion of metal wires and interconnecting studs.

Reference 4 does not specify an etch stop or the technique used for etching the stud, however the general idea is the same as in the three previously mentioned references. Reference 4 discusses the formation of bumps which will result subsequently in studs. It is to be noted that all the bumps are at the same elevation.

Reference 5 describes the formation of a planarized multilevel metal structure by a process which employs an intermediate blanket silicon nitride layer underneath. Once the silicon nitride layer has been deposited and patterned to expose the first level metal wire at the place where the stud is to be formed, the metal stud is then deposited and lifted off. A second layer of an insulating material, such as quartz or polyimide, is deposited, planarized and etched back to expose the top of the stud.

Reference 6 discloses the use of studs in a multiple metal layer lift-off process but does not deal with the problem of studs of unequal elevation.

Reference 7 solves the problem of studs of unacceptably unequal elevation by the use of a masked etching method which levelizes and insulates the studs for multilevel metal VLSI applications.

During the master slice process some irregularities are created by the nature of certain particular process steps. As a consequence, during the personalization all contacts are not made to the same depth. For example, depending on the particular process, collector regions may be deeper than base regions, and base regions may be deeper than emitter regions.

When the initial wires of the first level of metallization are placed on a substrate, e.g. a patterned silicon substrate to expose desired locations such as device contacts, they conform to its geometry; that is, they must reach into device contacts as well as run across various field oxides covering the silicon substrate. The contacts can be of various depths when compared to the silicon substrate surface. FIG. 1 shows such an irregular surface of a silicon substrate 10 and indicates typical depths of recesses where base and collector device contacts are to be formed. Consider now the formation of vertical wires or studs 11 which are placed on top of corresponding initial wires 12. Said studs will have different elevations depending on whether they are placed in a recess at certain contact locations (e.g. base and collector regions) or on the main surface 13 of the substrate 10. The studs have differences in elevation, although they all have the same height, as it obviously results from the metallization step. Such differences in elevation relative to the most elevated stud are referenced h1 and h2 in FIG. 1. A sequence of steps can be employed using an insulating layer which is then planarized by a thick photoresist and etched back with conditions which will remove unwanted insulator over the metal contacts. Considering the geometries involved, it is obvious that overetching is required during planarization to guarantee that the less elevated contact is exposed. It is furthermore obvious that during this overetch the insulator will be dangerously thinned near the most elevated contact. The most elevated contact will also have surface irregularities caused by the overetch. These surface irregularities cause reliability concerns for metal wiring that must traverse them.

Additionally, it is well known that metal wires, or lands, are not always the exact same size or area. That is, due to power loss considerations, some wires have to be wider than others. Consider now two wires of different sizes 20a and 20b, on the same wiring level 21 of a substrate 22 as shown in FIGS. 2A and 2B. The deposition of the insulating layer 23 is typically a conformal coating. Previous works assumed that the overlying layer 24 of a planarizing medium, such as polyimide or photoresist, will be flat regardless of the underlying geometric shapes. This is not necessarily true. The planarizing material will tend to be thicker over very wide geometries (e.g. 20b) than over very narrow ones (e.g. 20a) as shown in FIG. 2A. Thus, it is obvious that when the surface is planarized in a subsequent etch back step, there will be a residual insulator portion 23b remaining over the wider geometries (e.g. 20b) as is apparent from FIG. 2B.

Therefore, due to substrate surface irregularities and varying metallization widths, the silicon dioxide insulating layer which overlies, for example, the first level of metallization and associated studs, is of non-uniform elevation and thickness. It is therefore necessary to planarize said silicon dioxide layer to render it of uniform elevation, before applying subsequent metallization levels. Because the first level of metallization and studs lie at varying depths below the planarized surface, if all the stud locations were etched simultaneously, undesirable overetch of certain regions of the insulating layer would be required to expose the less elevated studs. More particularly, this overetch would render excessively thin the silicon dioxide in the region of the studs having the highest elevation and their surrounding metallization. This excessively thin insulation would in turn present a danger for low voltage breakdown and an increase in capacitance between the first and second metallization levels. These problems, caused by the irregularities of the substrate surface and by the differences in wire sizes which result in a non-uniform thickness of the insulating layer, have not been seriously investigated up to now, although they appear to be key detractors to a further increase in the number of metal levels.

These problems will be faced by anyone trying to manufacture silicon chips according to the teachings of the aforementioned references. First, elevation of the studs is important when trying to place studs directly on device contacts or when studs are resting at locations (field oxides, device contact regions, resistor regions, Recess Oxide Isolation boundaries, etc.) which are not at the same elevation. Designing a chip to intentionally have similarly elevated studs would force the circuit designer to lower density which is unacceptable. Secondly, studs cannot be of the same size everywhere and distribute the power effectively. Therefore, any process which claims planarity must be able to cope with studs of any size and defines "planarity" in that context. Thirdly, the formation of studs by metal RIE has not been proven as effective, technically or economically, as the lift-off process.

SUMMARY OF THE INVENTION

Following planarization of the first layer of an insulating material, typically silicon dioxide, the method of the present invention exposes only studs of the highest elevation by etching. Then, following exposure of the studs of the highest elevation, a second insulating material such as silicon nitride is deposited atop the silicon dioxide to assure that the breakdown voltage of the resulting composite insulating layer is sufficient to avoid premature voltage breakdown. Then the present method suggests the use of a photoresist etch mask to be formed over the whole structure in order to permit etching of the insulating layer. At this stage, the latter is comprised of the silicon nitride layer and thin remaining portions of the silicon dioxide layer over the studs having either the lowest elevation or the wider size. Etching must take place only in the regions of the structure where the studs are to be exposed. Finally, following the exposure of all studs, the photoresist etch mask is completely removed and the next level of metallization can be now applied on a significantly planarized structure.

In the present invention, this thin layer of silicon nitride provides a valuable additional insulator in all other areas of the chip.

OBJECTS OF THE INVENTION

It is therefore a first object of the invention to provide an improved stud vertical wiring technique for the manufacturing of VLSI, multiple level metallurgy semiconductor chips, which accommodates differences in both stud elevation and stud area.

It is another object of the invention to provide an improved stud vertical wiring technique where the stud and metal wire forming is achieved by a lift-off technique, providing minimum process bias, and avoiding the RIE techniques used in the prior art, which are sources of contamination, and in general necessitate the use of an etch-stop barrier.

It is still another object of the invention to provide an improved stud vertical wiring technique, where each insulating layer is kept at a substantially constant desired thickness for a better dielectric isolation, and subsequently planarized to remove surface irregularities to increase intralevel reliability.

It is still another object of the present invention to provide an improved stud vertical wiring technique where the final insulating layer is a composite insulator in order to enhance interlevel isolation, capacitance and reliability.

It is still another object of the present invention to provide an improved stud vertical wiring technique designed to be repetitive so that a semiconductor chip may receive a large number of metal layers.

The foregoing and other objects, features and advantages of the invention will be apparent from the following more particular description of a preferred embodiment of the invention as illustrated in the accompanying drawings forming a material part of the disclosure.

BRIEF DESCRIPTION OF THE DRAWINGS

FIG. 3 shows the semiconductor structure after the metal wires of the first level of metallization have been defined.

FIG. 4 shows the semiconductor structure of FIG. 3 after deposition and delineation of metal studs.

FIG. 5 shows the semiconductor structure of FIG. 4 after deposition of the first insulating layer.

FIG. 6 shows the semiconductor structure of FIG. 5 after deposition of a planarizing medium.

FIG. 7 shows the semiconductor structure of FIG. 6 after an etch back step to expose the most elevated stud and reduce the device topology for planarization.

FIG. 8 shows the semiconductor structure of FIG. 7 after deposition of a second insulating layer and mask patterning.

FIG. 9 shows the semiconductor structure of FIG. 8 after final etching and stripping of the resist to expose all studs and forming vias.

DESCRIPTION OF THE INVENTION

The present invention will be explained with reference to the attached FIGS. 3 to 10.

Figure 1:
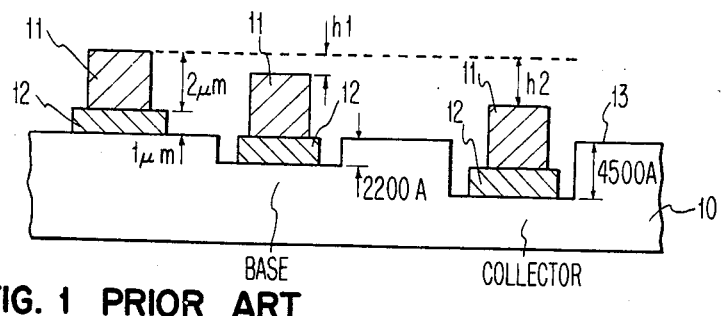
FIG. 1 shows a schematic cross sectional view of a semiconductor chip, pointing out the irregular surface of the silicon substrate resulting from the conventional masterslice process.
Figure 2A:
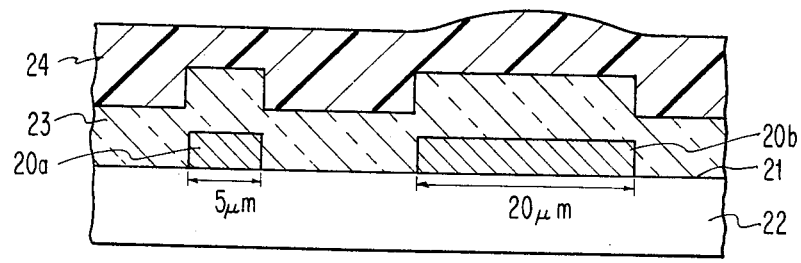
FIGS. 2A and 2B show very schematic cross sectional views of a semiconductor substrate pointing out the effects metal wires of different sizes on the conventional planarization process.
Figure 2B:
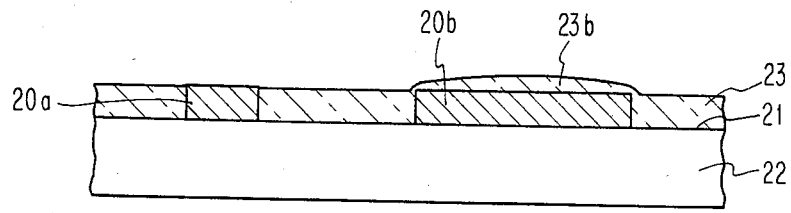
Figure 3:
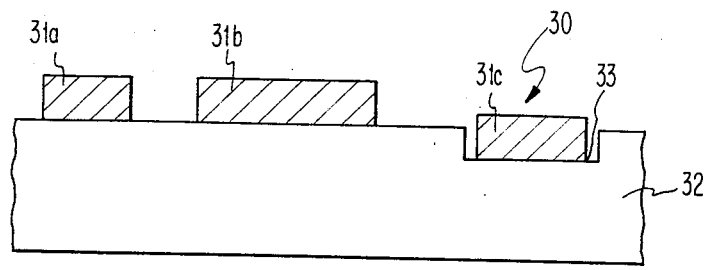
FIGS. 3 to 9 illustrate cross sectional views of an integrated semiconductor structure undergoing the personalization process according to the method of the present invention.

FIG. 3 shows the schematic representation of a typical semiconductor structure 30 with an irregular surface topology (not to scale). The metal layer of the first level of metallization has been delineated and defined according to well known techniques such as lift-off. Resulting metal wires 31a, 31b and 31c, of about 1 μm thick, form electrical contacts with desired regions of the semiconductor substrate 32, typically in silicon. This step is the first of the personalization sequence as it will be apparent to one skilled in the art. Metal wire 31c is formed in a recess 33 corresponding for example to the base or collector region of an NPN bipolar transistor. Metal wire 31b which has a larger size compared to other metal wires 31a and 31c acts as a power bus.

Figure 4:
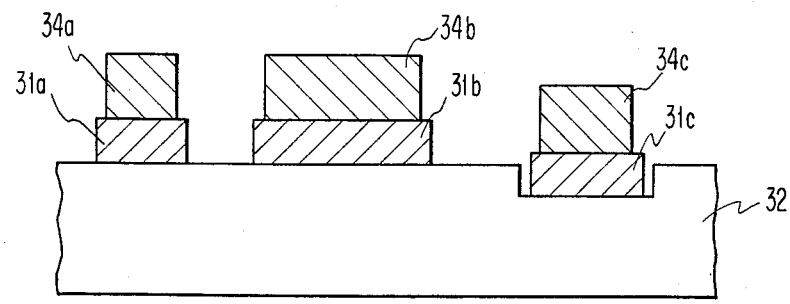

Repeating the lift-off process using a so-called stud mask to expose the lift-off mask photoresist (not represented), produces the structure shown in FIG. 4, where the metal vertical wires or studs 34a, 34b and 34c of ~2.0 μm thick, are formed above their corresponding metal wires 31a, 31b and 31c. They will form the interconnection between the first and second levels of metallization. Although in the preferred embodiment described above, studs are formed on metal wires of the first level of metallization, it is to be understood that studs may be formed directly on device contacts as well. Metal studs can be thought as short cylindrical wires standing on end. Studs on contacts or studs on wires have been shown to result in significant density improvements, since valuable real estate is saved to make the electrical connections. It is important to notice, that the studs, while being of the same height (as a result of the deposition process), do not reach the same elevation.

U.S. Pat. No. 4,004,044 assigned to the assignee of the present invention contains all the technical data necessary to one skilled in the art to undertake the lift off steps as used with reference to FIGS. 3 and 4.

FIG. 4 shows the resulting semiconductor structure with significant differences (not at scale) in both stud elevation and stud size, in order to facilitate an understanding of the value of the present method.

Figure 5:
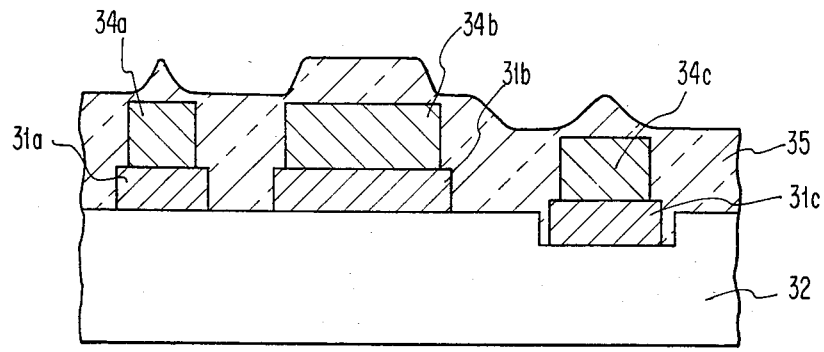

As shown in FIG. 5 during the next processing step, the structure is covered with a first insulating layer 35. The material of said first insulating layer is preferably silicon dioxide. $SiO_2$ may be deposited according to standard sputtering techniques. Other dielectric materials, such as spin-on polyimide, are also suitable. The surface of said first insulating layer is highly conformal, and therefore its thickness varies only slightly depending on underlying geometric shapes.

Figure 6:
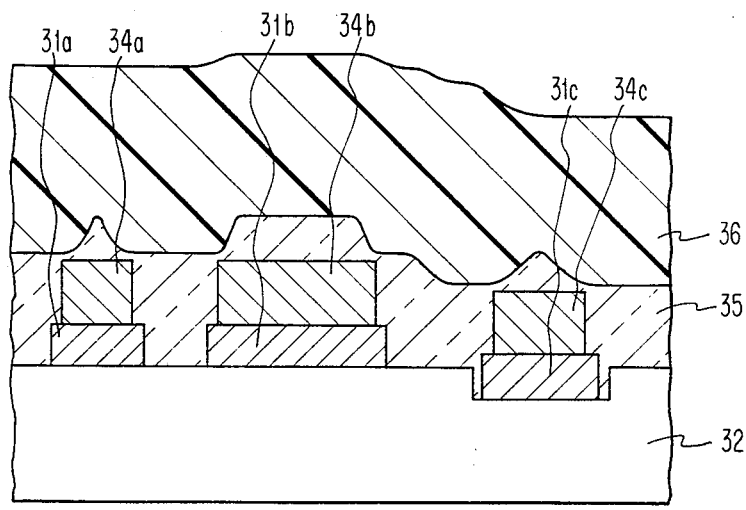

A layer 36 of a planarizing medium, e.g. a standard polyimide or preferably a photoresist such as AZ 1350 J, is applied and baked at a high enough temperature to cross-link the resist and prevent charring in the subsequent RIE steps. It is preferred that the resist be relatively thick (at least the total metal thickness and preferably twice, e.g. 3 to 6 μm thick) so as to produce a relatively planar surface, as shown in FIG. 6. No pattern exposure is required since the resist is present only to act as a sacrificial layer.

Figure 7:
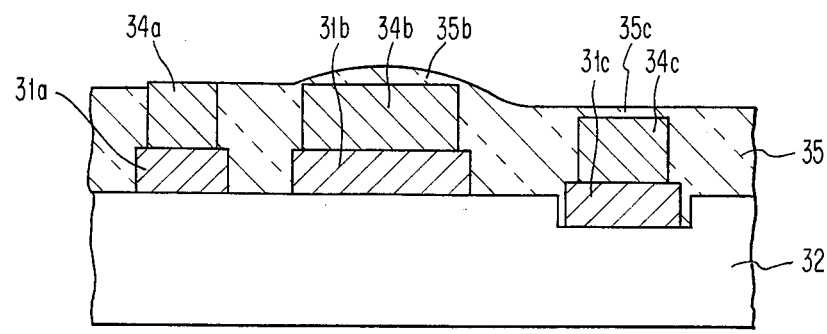

The etching process, called etchback, is done with a gas mixture and associated parameter values such that, both photoresist and insulator material forming said first insulating layer 35 will be etched at approximatly the same rate. FIG. 7 shows the result of the etchback process where the most elevated stud 34a has been exposed by the etchant while the less elevated one 34c has not, being protected by a thin remaining portion 35c of the insulating layer 35. Due to its larger size, the intermediate stud 34b is also protected by a thin remaining portion 35b of the insulating layer 35. Additional overetching to open the unexposed studs at this point as practiced in the conventional prior techniques, could be detrimental to the insulator quality at other locations. Any etch stop detector, such as involving laser beam, may be used on a special test site to detect and stop the etching process when the most elevated stud has been exposed. The etchant is one that attacks the planarizing medium as well as the silicon dioxide but not the metal. An appropriate etchant is a mixture of CF4 and O2 (8%).

The operating parameters are:
flow—50 scc/min.
pressure—25 $\mu$M
power density—0.75 watts/cm$^2$ At this point, as clearly depicted in FIG. 7, the surface of the SiO2 insulating layer has been significantly planarized everywhere and major irregularities have been removed, so that subsequent metal wires do not have to cover steps. As we said previously, sharp edges are often detrimental to device reliability.

Figure 8:
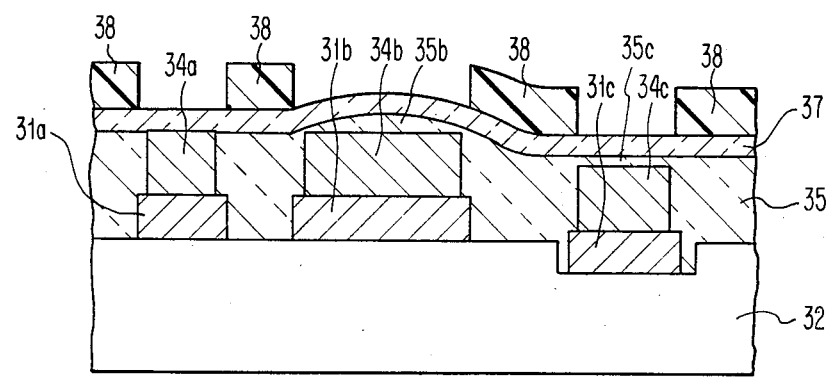

A second insulating layer 37 comprised of an insulator such as silicon nitride of 290 nm thick (not critical), is blanket deposited, e.g. by low temperature standard plasma techniques, on the structure of FIG. 7. A composite Si3N4/SiO2 insulating layer therefore passivates the structure at this stage of the process. As shown in FIG. 8, a conventional photoresist process sequence of applying a photoresist layer 38, exposing, developing and baking it, is then done to define the image of the desired pattern. In this case, the mask used for exposure of photoresist layer 38 is the same one that was previously used to define the vertical wires or studs and which was referenced above as the stud mask. Once patterned, the photoresist layer leaves a mask still referenced by numeral 38 in FIG. 8.

The presence of a composite insulating layer for passivating the structure has obvious advantages, including the reduction of interlevel shorts, better voltage breakdown characteristics, . . . .

Another etching in a Reactive Ion Etch (RIE) equipment is effected to attack both Si3N4 and SiO2. CF4 is an appropriate etchant gas.

The operating parameters are:
power—1300 watts
pressure—100 $\mu$m
flow—50 scc/min.

Figure 9:
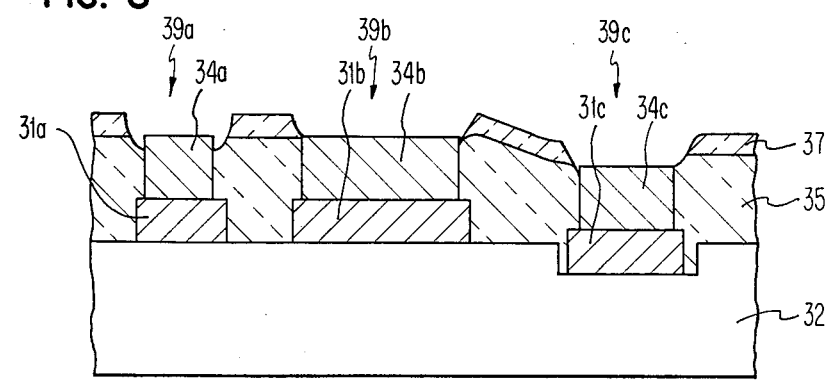

The aim is to etch through the silicon nitride and remove any residue of the silicon dioxide layer (e.g. 35b, 35c) that was left after the etchback step. The etch mask is the patterned photoresist mask 38 which is left in place to etch exposed portions of both Si3N4 and residual SiO2 layers, all together. The Si3N4 layer alone cannot be used as a mask for the residual SiO2, because Si3N4 is etched twice as fast in the RIE equipment. The Si3N4 layer and the residual portions of the SiO2 layer are removed through openings in said etch mask without reducing the thickness of the composite insulating layer at other locations on the chip. The etch mask 38 is stripped away in a conventional manner and the resulting structure is shown in FIG. 9. The shallow vias formed during the silicon nitride etching step need only be as deep as the lowest contact and are usually less than half a micron. At this point, the structure is ready for the next metal level and the process (as described with reference to attached FIGS. 3 to 9) is repeated as many times as necessary. In this way, fabricating chips with more than three metal levels does not present any difficulty.

The vias or openings 39a, 39b and 39c in the Si3N4 are shallow as the etching is performed only until all residues are removed. The resulting surface geometry has been planarized everywhere except for the vias. Insulator thinning which may be noticed in FIG. 9 in the upper annular area around the stud is of no consequence. In this way the forementioned problems of previous techniques have been overcome, and viable chips with planar surface, reliable composite insulator and reliable interconnections have been successfully formed.

The fabrication of the chip is continued until final completion, through conventional BLM (Ball Limiting Metallurgy) processes.

Figure 10:
FIG. 10 shows a SEM photography of a cross sectional view of a semiconductor structure with four levels of metallization obtained in accordance with the present invention.

FIG. 10 is an SEM photography of the cross section of a four metal level chip obtained according to the teachings of the present invention. Note that the final topology is quite planar and the underlying geometries are adequately insulated. The photograph shows studs which allow for electrical contact directly from first level metal layer to second level metal layer and from second level metal to third level metal layer.

The vertical wiring process is a relatively new concept in the wiring of semiconductor chips. It has introduced three major architectural features which allow circuit designers to take advantage of a reduced wiring pitch and improve density. These three features are studs, composite insulators and planar surfaces. Studs can now be placed directly over device contacts or stacked to provide communication with upper wiring levels. The use of the lift-off process, with its minimum process bias, promises to allow the capability to form interconnections much smaller than can be achieved by via hole etching while maintaining insulator thicknesses. Thus, image sizes can be reduced significantly without the need for more advanced photolithography tools and without the need to reduce the insulator thickness. In fact, insulator thickness is now limited only by the height of the stud and not by other problems such as resist thickness, image quality or resist flow. While the state-of-the-art via etch processes can reduce the via diameter, it does so at the expense of insulator thickness and capacitance. The stud process can maintain, or even increase, the insulator thickness and hence reduce circuit capacitance to a minimum.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. In a method for making studs for interconnecting metallization layers at different levels in a semiconductor chip, the improvement including the steps of:
   (a) forming metal studs at desired device contact regions of a semiconductor substrate by a lift off process with a stud mask, said studs being noncoplanar;
   (b) blanket depositing a first insulating layer of a first insulating material over the entire surface of said substrate to cover the studs, said first insulating layer having a non-uniform height;

(c) depositing a planarizing material over said first insulating layer, said medium having a substantially planar upper surface;
(d) removing said material and said first insulating layer at substantially the same rate by an etching process until the most elevated of said studs is exposed while other studs remain covered;
(e) blanket depositing a second insulating layer over the entire surface of said substrate;
(f) forming and patterning an etch mask according to said stud mask over said second insulating layer;
(g) using said etch mask to selectively etch said second insulating layer at all stud locations and to etch any residue of the underlying first insulating layer where present, over the locations of said studs, in order to expose all studs at the end of this step; and,
(h) applying and patterning the next level of metallization.

2. The method of claim 1 wherein prior to the forming of said metal studs, metal wires of the first level of metallization are formed at said desired device contact regions.

3. The method of claim 1 further including the steps of repeating all of the above defined steps (a) to (h) any number of times.

4. The method of claim 1 wherein the material forming said first insulating layer is silicon dioxide.

5. The method of claim 1 wherein the material forming said second insulating layer is silicon nitride.

6. The method of claim 5 wherein the thickness of said second insulating layer is approximately 290 nm.

7. The method of claim 1 wherein said planarizing material is photoresist or polyimide.

8. The method of claim 7 wherein the thickness of said material is at least twice the total metal thickness.

* * * * *